United States Patent
Liao

(10) Patent No.: US 7,323,928 B1
(45) Date of Patent: Jan. 29, 2008

(54) HIGH CAPACITANCE INTEGRATED CIRCUITS

(75) Inventor: Chiawei Liao, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/412,778

(22) Filed: Apr. 11, 2003

(51) Int. Cl.
*H04B 1/10* (2006.01)

(52) U.S. Cl. .............. 327/554; 327/524; 327/552; 307/109; 365/149

(58) Field of Classification Search .......... 327/524, 327/261, 263, 272
See application file for complete search history.

(56) References Cited

U.S. PATENT DOCUMENTS

| | | | | |
|---|---|---|---|---|
| 3,831,117 A | * | 8/1974 | Fletcher et al. ......... 330/302 |
| 4,025,867 A | | 5/1977 | Seidel ................... 327/552 |
| 4,100,515 A | | 7/1978 | Gupta ................... 333/215 |
| 4,709,159 A | | 11/1987 | Pace .................... 257/532 |
| H416 H | | 1/1988 | Colvin .................. 361/398 |
| 5,327,027 A | * | 7/1994 | Taylor .................. 327/524 |
| 5,606,197 A | | 2/1997 | Johansson et al. ....... 257/532 |
| 5,726,599 A | | 3/1998 | Genest ................... 327/553 |
| 5,835,403 A | * | 11/1998 | Forbes .................. 365/149 |
| 5,900,771 A | | 5/1999 | Bremner ................. 327/524 |
| 6,040,730 A | * | 3/2000 | Ferrario ................ 327/344 |
| 6,344,772 B1 | * | 2/2002 | Larsson ................. 327/552 |
| 6,744,292 B2 | * | 6/2004 | Chen et al. ............. 327/156 |

* cited by examiner

*Primary Examiner*—N. Drew Richards
*Assistant Examiner*—Hiep Nguyen
(74) *Attorney, Agent, or Firm*—McDermott Will & Emery LLP

(57) ABSTRACT

An integrated circuit providing high equivalent capacitance ranging from a few tens of picofarads to a few nanofarads is presented. The integrated circuit includes active integrated circuit components, requires no external capacitor, and is substantially insensitive to transistor current gain variations. The high capacitance integrated circuit can be advantageously used to provide, for example, timing delay and servo loop compensation.

16 Claims, 4 Drawing Sheets

HIGH CAPACITANCE INTEGRATED CIRCUITS

BACKGROUND OF THE INVENTION

This invention relates to integrated circuits. More particularly, this invention relates to integrated circuits that provide high capacitance.

Very often, electrical circuits require a high capacitance ranging from a few tens of picofarads to a few thousand picofarads (i.e., nanofarads). Such high capacitance is used, for example, to compensate a servo loop or to delay signal timing. However, integrated circuits typically can provide capacitance only in the tens of picofarads because of the practicalities and economics of integrated circuit fabrication.

A common solution is to add an external or discrete capacitor to an integrated circuit requiring high capacitance. However, this requires a connection from the external capacitor to an integrated circuit package pin, which in many instances may not be available. Moreover, physical space for the addition of an external capacitor may also not be available depending on the component density and packaging of the system or device in which the integrated circuit is used.

As used herein, the term "integrated circuit" does not necessarily refer to a complete integrated circuit chip, but can instead refer to an integrated circuit portion of an integrated circuit chip. However, an integrated circuit does not refer to more than one integrated circuit chip.

Another known solution is to use area ratios of transistors on an integrated circuit to effectively "multiply" existing capacitance in the circuit to provide a desired high equivalent capacitance. However, capacitance multiplication is very sensitive to variations in transistor current gain, which in turn is sensitive to process variations and operating temperatures. Thus, known integrated multiplier circuits cannot be reliably fabricated with a specific effective capacitance, nor is an effective capacitance of known multiplier circuits likely to remain constant during subsequent circuit operation. Furthermore, only low multiplication factors (less than about 40) are possible because of transistor size limitations on integrated circuits.

In view of the foregoing, it would be desirable to be able to provide an integrated circuit having a high equivalent capacitance that does not require additional components external to the integrated circuit.

It would also be desirable to be able to provide an integrated circuit having a specified high equivalent capacitance that is substantially unaffected by transistor current gain variations.

SUMMARY OF THE INVENTION

It is an object of this invention to provide an integrated circuit having a high equivalent capacitance that does not require additional components external to the integrated circuit.

It is also an object of this invention to provide an integrated circuit having a specified high equivalent capacitance that is substantially unaffected by transistor current gain variations.

In accordance with the invention, an integrated circuit having high equivalent capacitance is provided. The effective capacitance is internal to the circuit, which includes simple active circuit elements. Advantageously, capacitance magnification provided by the circuit is high, specifiable, reliably fabricated, and substantially insensitive to transistor current gain variations. Moreover, capacitance magnification according to the invention is not limited by the physical sizes of the transistors in the integrated circuit. While the integrated circuit of the invention includes transistors for area ratio capacitance magnification, that magnification is amplified by additional transistors providing output current feedback. Furthermore, the capacitance magnification is buffered against the effects of transistor current gain variations.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
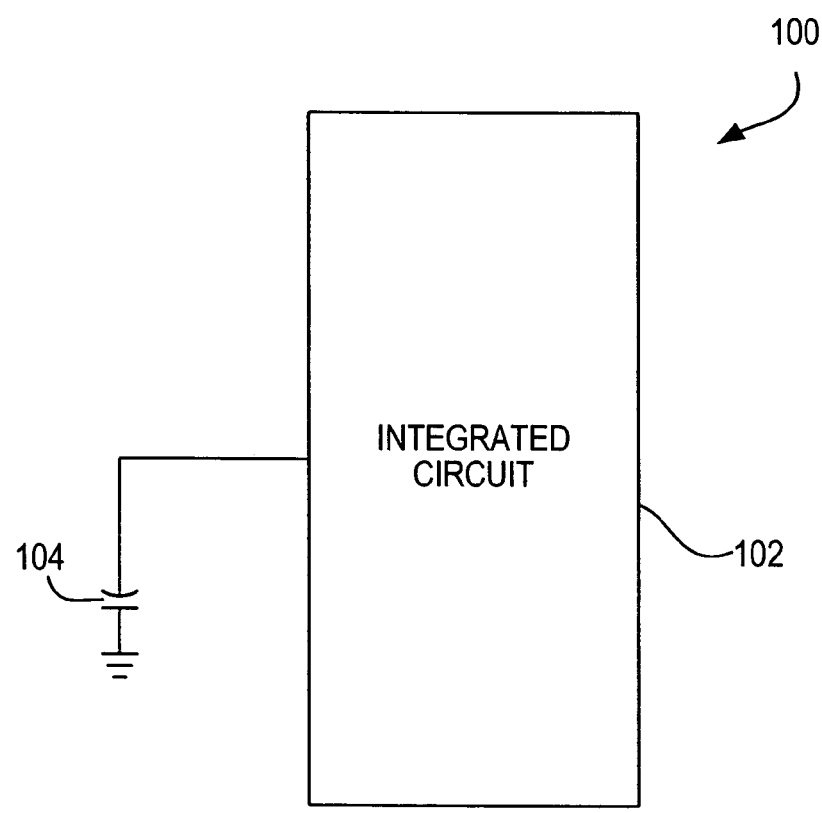
FIG. 1 is a simplified diagram of a known method of providing an integrated circuit with high capacitance.

FIG. 1 shows a known solution to providing high capacitance to an integrated circuit. Circuit 100 includes an integrated circuit ("IC") 102 coupled to an external capacitor 104. IC 102 can provide one or more dedicated or programmable functions. Capacitor 104 can have any appropriate value as required by IC 102 or the application of circuit 100. A disadvantage of this circuit is that an input/output ("I/O") pin in the package (e.g., a chip module) of IC 102 is needed to connect capacitor 104 to IC 102. As is known, however, unused I/O pins can be rare in high density integrated circuit packages. Similarly, space for capacitor 104 on the card or board on which IC 102 is mounted also may not be available in view of the high component densities and compact sizes of electronic devices today.

Figure 2:
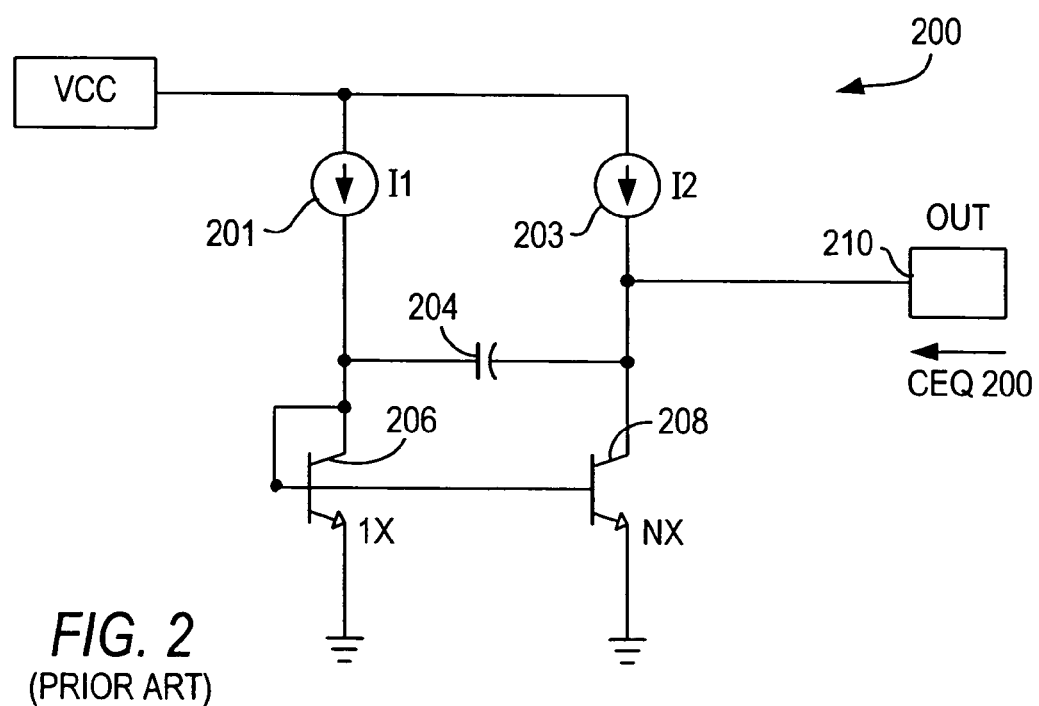
FIG. 2 is a circuit diagram of a known capacitance multiplier circuit.

FIG. 2 shows a known capacitance multiplier circuit 200. Circuit 200 includes current sources 201 and 203, capacitor 204, NPN transistors 206 and 208, and output node 210. The physical size of the emitter of transistor 208 is N times as large as the size of the emitter of transistor 206. Theoretically, the capacitance of capacitor 204 can be effectively multiplied N+1 times if transistor 208 has very high current gain ($\beta$). Looking into circuit 200 from output node 210, the equivalent capacitance is $$C_{EQ200}=(1+A) \cdot C_{204} \qquad (1)$$

where A is the incremental current gain $dI_2/dI_1$ ($dI_1$ flows through capacitor 204). Currents $I_1$ and $I_2$ are bias currents that are needed only if $C_{EQ200}$ sources current. To calculate A:

$$V_{BE206}=V_{BE208} \qquad (2)$$

$$I_{S208}=N \cdot I_{S206} \qquad (3)$$

where $V_{BE}$ is transistor base-to-emitter voltage and $I_S$ is transistor saturation current.

$$vt \cdot \ln\frac{I_{C206}}{I_{S206}} = vt \cdot \ln\frac{I_{C208}}{I_{S208}} \quad (4)$$

$$\frac{I_{C206}}{I_{C206}} = \frac{I_{C208}}{I_{S208}} \quad (5)$$

where Vt is transistor thermal voltage (kT/q=26 millivolts at room temperature), ln is the natural logarithm, and $I_C$ is collector current.

$$\frac{I_1 - \frac{I_2}{\beta}}{I_{S206}} = \frac{I_2}{I_{S208}} \quad (6)$$

$$\frac{I_{S208}}{I_{S206}} I_1 = 1 + \frac{I_{S208}}{I_{S206}} \frac{1}{\beta} I_2 \quad (7)$$

where β is current gain. Taking the first derivative yields:

$$\frac{dI_2}{dI_1} = \frac{\frac{I_{S208}}{I_{S206}}}{1 + \frac{I_{S208}}{I_{S206}} \frac{1}{\beta}} \quad (8)$$

$$\frac{N}{1 + \frac{N}{\beta}} = A \quad (9)$$

Accordingly, A approaches N only if β is much larger than N. As β becomes smaller, A becomes smaller. At β=N, A is equal to one-half N.

Integrated circuit process variations and operating temperature ranges, however, can cause β to vary typically by 3x. Thus, assuming a β ranging from 50 to 150, the tolerance on the value of $C_{EQ200}$ can be 30% due to β variation alone, limiting N to 21. Accordingly, high β sensitivity limits the capacitor multiplication factor A to very low values, typically 10 to 20. Even with a transistor 208 base current cancellation circuit (known in the art), the theoretical maximum multiplication factor is only N, and N is typically less than 40 because of transistor size limitations in integrated circuits. In other words, the maximum multiplication factor A cannot be greater than the transistor 208/206 size ratio N.

Figure 3:
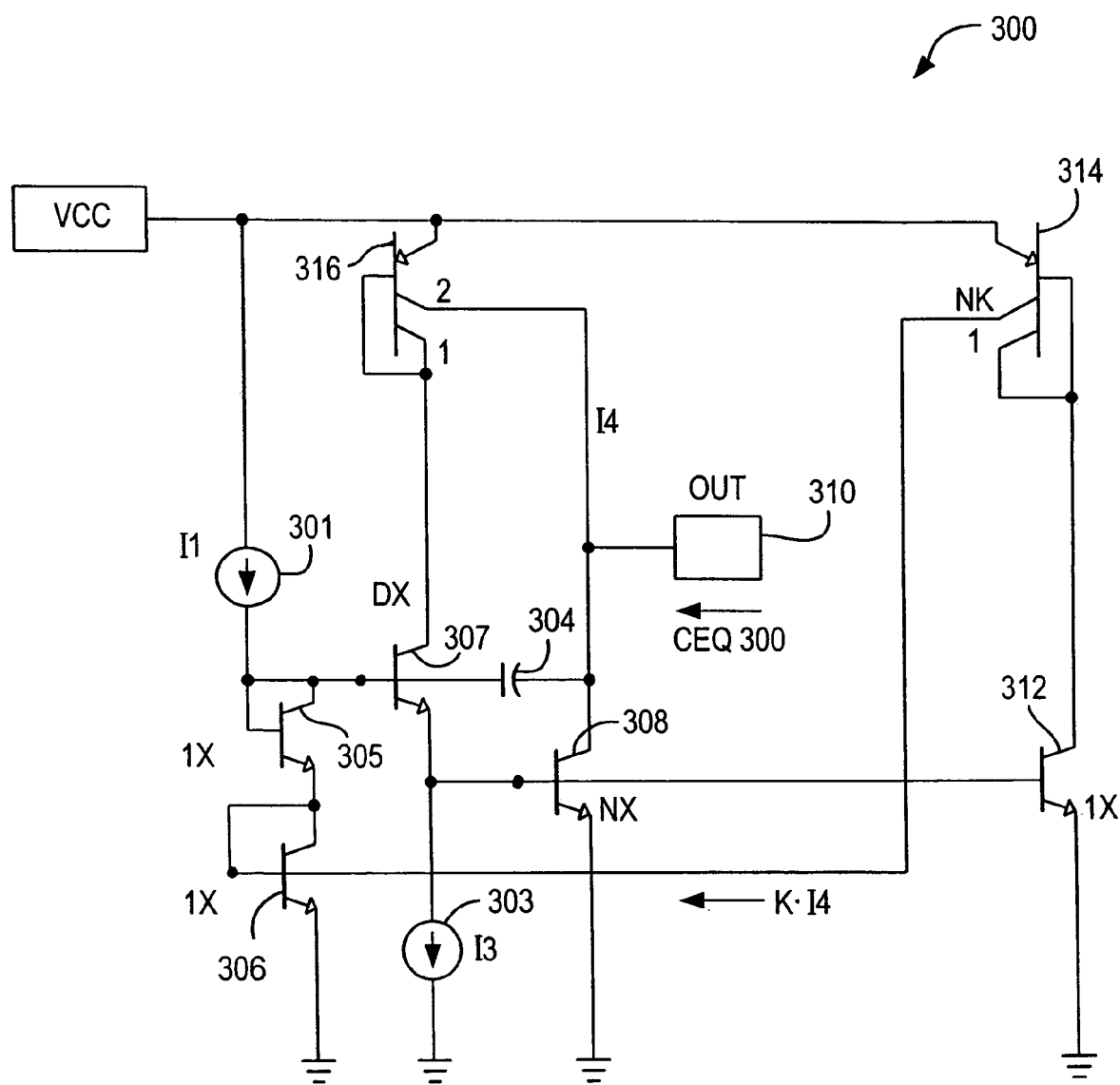
FIG. 3 is a circuit diagram of an embodiment of an integrated circuit having a high equivalent capacitance according to the invention.

FIG. 3 shows an embodiment of a capacitance magnification circuit according to the invention. Circuit 300 provides a well controlled high internal equivalent capacitance that does not have high β sensitivity. Moreover, the capacitance magnification factor is not limited by the transistor physical size ratio N, as in known circuits. Circuit 300 preferably includes current sources 301 and 303, capacitor 304, NPN transistors 305, 306, 307, 308, and 312, output node 310, and multi-collector PNP transistors 314 and 316. Transistors 305 and 306 preferably have emitters of equal size (represented by "1x"), while transistor 307 has an emitter "D" times as large, and transistor 308 has an emitter "N" times as large, as the emitters of transistors 305 and 306. As shown, a first collector of transistor 314 is preferably (N·k) times larger than the second collector of transistor 314, and a first collector of transistor 316 is preferably twice as large as the second collector of transistor 316. Currents $I_1$, $I_3$, and $I_4$ provide DC bias that enables circuit 300 to source and sink current. The base-to-emitter voltages ($V_{BE}$) of transistors 305 and 306 stack up to become the input voltage to transistor 307. The $V_{BE}$ of transistor 307 is constant. Output transistor 308 has a current gain in accordance with:

$$V_{BE305} + V_{BE306} - V_{BE307} = V_{BE308} \quad (10)$$

Transistor 316 generates current $I_4$ from current $I_3$. Looking into circuit 300 from output node 310, output current is distributed into two paths, one including capacitor 304 and the other including the collector of transistor 308. Any AC current $I_{C1}$ flowing through capacitor 304 also flows through transistors 305 and 306. This incremental current change $dI_1$ on DC bias current $I_1$ causes a change in the base-to-emitter voltages of transistors 305 and 306. These $V_{BE}$ changes cause $I_{C4}$ to change ($I_{C3}$ is constant) with an incremental current gain of:

$$A = \frac{dI_4}{dI_1} \quad (11)$$

where $dI_4$ is the incremental change on DC bias current $I_4$. With current gain A, equivalent capacitance $C_{EQ300}$ is:

$$C_{EQ300} = (1+A) \cdot C_{304} \quad (12)$$

Advantageously, a magnification factor much larger than size ratio N is achieved by feeding back a current (shown as k·$I_4$ in FIG. 3), which is a function of output current $I_4$, from current mirror transistor 312 and turnaround transistor 314 to input transistor 306. This regenerative process significantly amplifies gain factor A. $C_{EQ300}$ can be determined by the following equations:

$$V_{BE305} + V_{BE306} = V_{BE307} + V_{BE308} \quad (13)$$

$$vt \cdot \ln\frac{I_1}{I_{S305}} + vt \cdot \ln\frac{I_1 + k \cdot I_4}{I_{S306}} = vt \cdot \ln\frac{I_3}{I_{S307}} + vt \cdot \ln\frac{I_4}{I_{S308}} \quad (14)$$

$$\text{let } W = \frac{I_{S307} \cdot I_{S308}}{I_{S305} \cdot I_{S306}} \quad (15)$$

$$I_1(I_1 + k \cdot I_4) = \frac{1}{W}(I_3 \cdot I_4) \quad (16)$$

Taking the first derivative yields:

$$2I_1 \cdot dI_1 + k \cdot I_4 \cdot dI_1 + k \cdot I_1 \cdot dI_4 = \frac{I_3}{W} dI_4 \quad (17)$$

($I_3$ is a constant)

$$\frac{dI_4}{dI_1} = A = \frac{2I_1 + k \cdot I_4}{\frac{I_3}{W} - k \cdot I_1} \quad (18)$$

where again $V_{BE}$ is transistor base-to-emitter voltage, Vt is transistor thermal voltage, $I_C$ is collector current, and $I_S$ is saturation current. Currents $I_1$, $I_3$, and $I_4$ are DC bias currents that flow only if $C_{EQ300}$ sources current.

The following example illustrates the capacitance magnification effect of circuit 300. Let capacitor 304=5 pf, $I_4$=20

μA, I$_3$=10 μA, I$_1$=0.75 μA, N=10, and D=5. To balance current density and satisfy equation (13), transistor 306 collector current is 5.33 μA, which results in feedback current k·I$_4$=(5.33 μA−I$_1$)=4.58 μA and k=4.58/20=0.229. From the given values and W=N·D=50, magnification factor A can be calculated from equation (18) as follows:

$$\frac{dI_4}{dI_1} = A = \frac{2(0.75)+4.58}{\frac{10}{50}-(.229)(0.75)} = 215 \tag{19}$$

The equivalent capacitance of circuit 300 can now be calculated as follows:

$$C_{EQ300}=(1+215)\cdot 5 \text{ pf}=1080 \text{ pf} \tag{20}$$

Thus, with N equal to only 10 and circuit 300 including only a few more 1×-sized transistors than in known circuit 200, magnification A for this example is about 10 to 20 times greater than that for known circuit 200, where A is limited to the value of size ratio N. Moreover, magnification factor A can be increased further in accordance with equation (18).

Note that the invention is not limited by or to the values used in the above example. Other component values based on, for example, transistor parameters of a specific process or a particular capacitance application can also be used in accordance with the invention.

The sensitivity of magnification factor A to the current gain of transistor 308 is reduced by an order of magnitude (and thus to a negligible level) because of the buffering effect of transistor 307 (recall that the V$_{BE}$ of transistor 307 is constant). Thus, changes in output current I$_4$ have little to no effect on gain-setting transistors 305 and 306.

Advantageously, variations in magnification factor A are caused primarily by only transistor size mismatching—which is uncommon in state of the art integrated circuit fabrication where transistor size matching can be done with a high degree of accuracy.

Figures 4, 5:
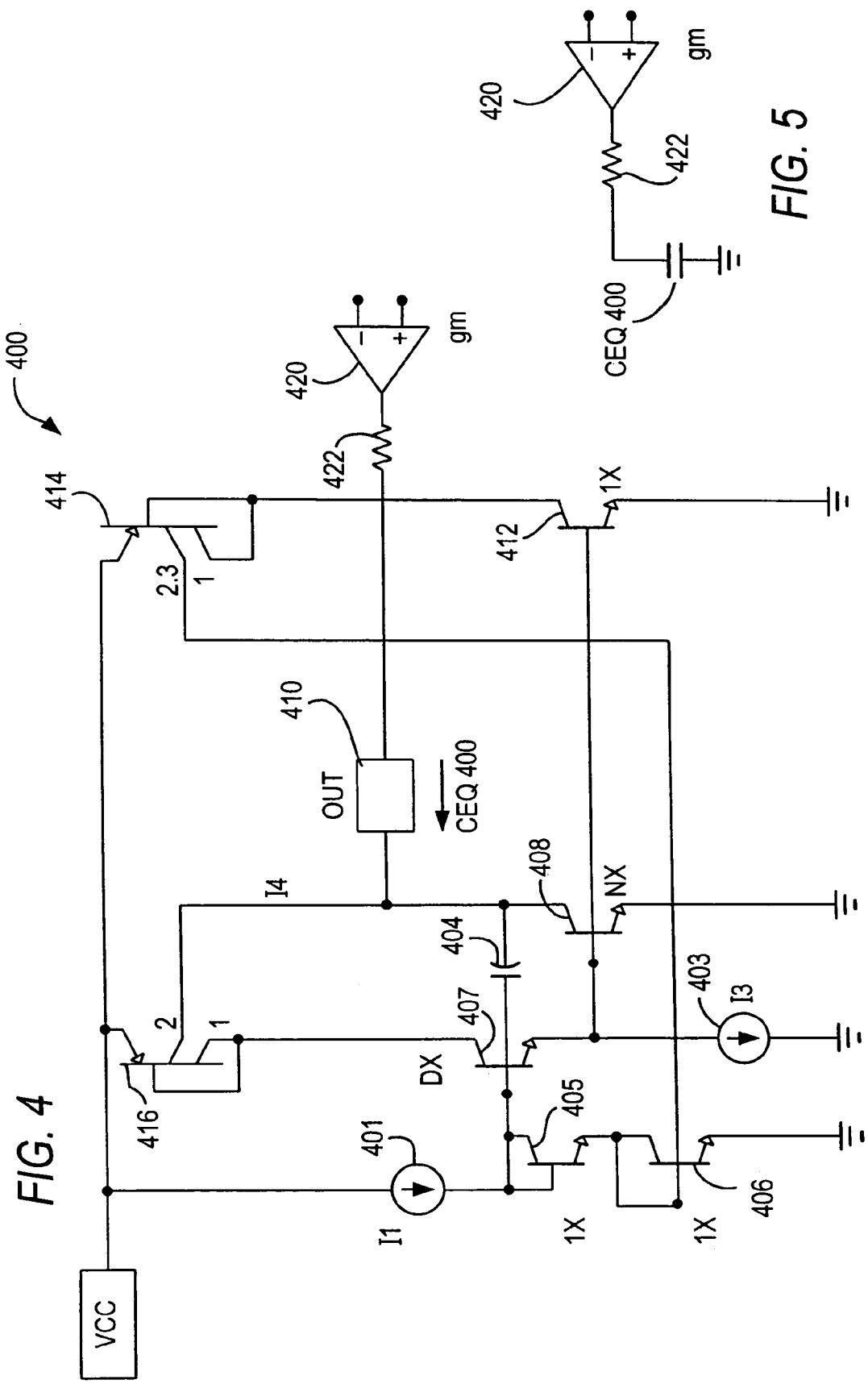
FIG. 4 is a circuit diagram of an application of the circuit of FIG. 3 according to the invention.
FIG. 5 is a circuit diagram of the application of FIG. 4 showing an equivalent circuit for the circuit of FIG. 3.

FIG. 4 shows a particularly useful application of circuit 300. A transconductance amplifier 420 is coupled via a resistor 422 to capacitance output node 410. The equivalent capacitance looking into output node 410 (shown representationally in FIG. 5 as capacitor C$_{EQ400}$) advantageously provides internal loop compensation for a feedback system including transconductance amplifier 420. Internal compensation prevents oscillation in closed loop amplifier circuits. Circuit 400 also includes current sources 401 and 403, capacitor 404, NPN transistors 405, 406, 407, 408, and 412, output node 410, and multi-collector PNP transistors 414 and 416. In this embodiment, a first collector of transistor 414 is 2.3 times larger than the second collector of transistor 414, as shown in FIG. 4. Transistors 405 and 406 have emitters of equal size, while transistor 407 has an emitter D times as large, and transistor 408 has an emitter N times as large, as the emitters of transistors 405 and 406. Currents I$_1$, I$_3$, and I$_4$ provide DC bias.

Figure 6:
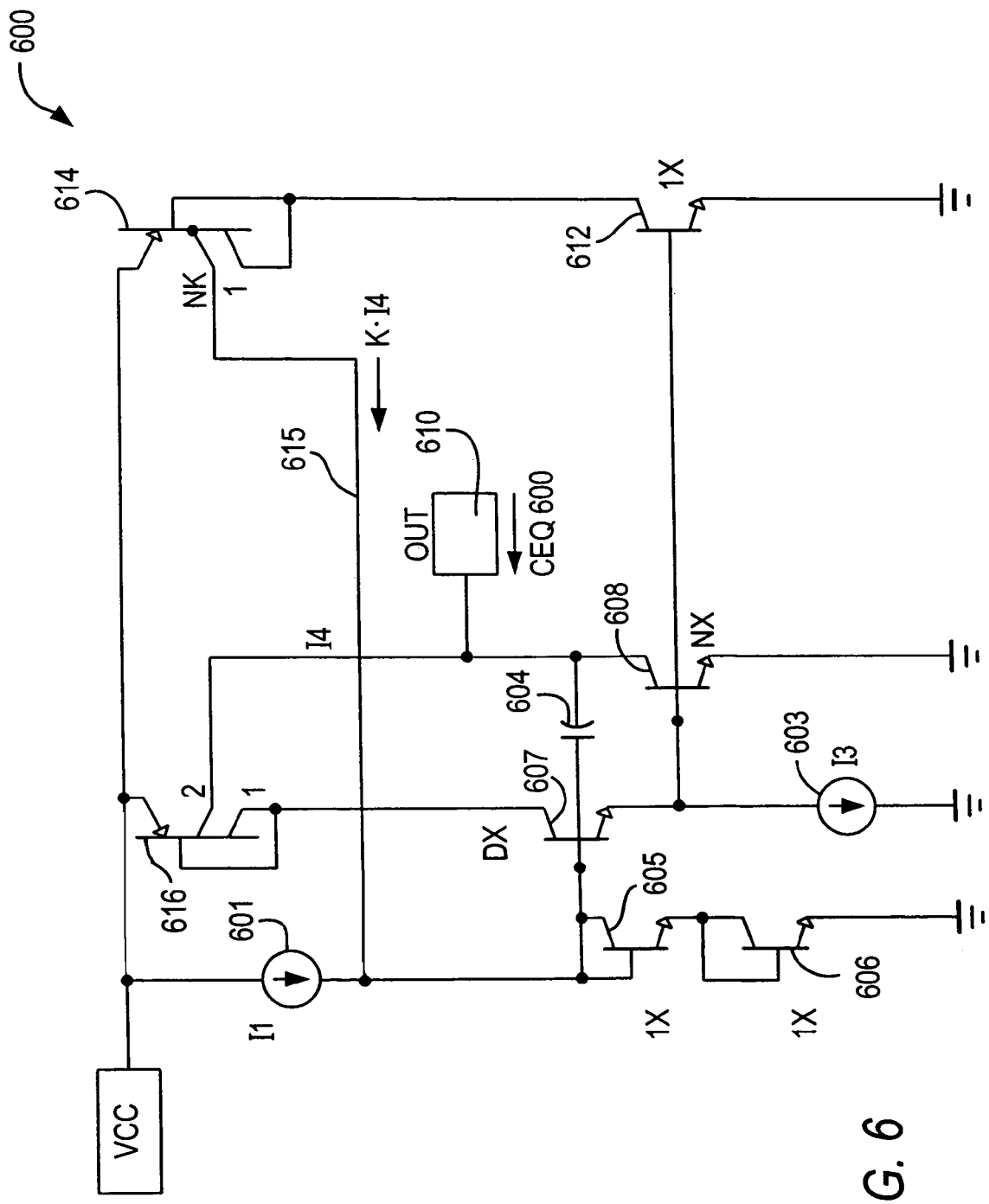
FIG. 6 is a circuit diagram of another embodiment of an integrated circuit having a high equivalent capacitance according to the invention.

FIG. 6 shows another embodiment of a capacitance magnification circuit according to the invention. Circuit 600 provides a well controlled high internal equivalent capacitance that does not have high β sensitivity. Moreover, the capacitance magnification factor is not limited by the transistor physical size ratio N. Circuit 600 includes current sources 601 and 603, capacitor 604, NPN transistors 605, 606, 607, 608, and 612, output node 610, and multi-collector PNP transistors 614 and 616.

Circuit 600 differs from circuit 300 in that the output current feedback path 615 from the larger collector of transistor 614 is coupled to the base and collector of transistor 605 instead of the base and collector of transistor 606 as in circuit 300. The performance of circuit 600, however, is substantially similar to that of circuit 300. Equivalent capacitance C$_{EQ600}$ is:

$$C_{EQ600}=(1+A)\cdot C_{604} \tag{21}$$

where A can be determined from:

$$V_{BE605}+V_{BE606}=V_{BE607}+V_{BE608} \tag{22}$$

$$Vt\cdot\ln\frac{I_1+k\cdot I_4}{I_{S605}}+Vt\cdot\ln\frac{I_1+k\cdot I_4}{I_{S606}}=Vt\cdot\ln\frac{I_3}{I_{S607}}+Vt\cdot\ln\frac{I_4}{I_{S608}} \tag{23}$$

$$\text{let } W = \frac{I_{S607}\cdot I_{S608}}{I_{S605}\cdot I_{S606}} \tag{24}$$

$$(I_1+k\cdot I_4)^2 = \frac{1}{W}(I_3\cdot I_4) \tag{25}$$

$$I_1^2 + 2k\cdot I_1\cdot I_4 + k^2\cdot I_4^2 = \frac{1}{W}(I_3\cdot I_4) \tag{26}$$

Taking the first derivative yields:

$$2I_1\cdot dI_1 + 2k\cdot I_4\cdot dI_1 + 2k\cdot I_1\cdot dI_4 = \frac{I_3}{W}dI_4 \tag{27}$$

(I$_3$ is a constant)

$$\frac{dI_4}{dI_1} = A = \frac{2I_1 + 2k\cdot I_4}{\frac{I_3}{W} - 2k\cdot I_1} \tag{28}$$

Thus it is seen that integrated circuits having high internal equivalent capacitance are provided. One skilled in the art will appreciate that the invention can be practiced by other than the described embodiments, which are presented for purposes of illustration and not of limitation, and the invention is limited only by the claims which follow.

I claim:

1. A method of providing capacitance with an integrated circuit, said method comprising:
   amplifying a first current across a capacitor to generate an amplified current, said amplified current having a greater magnitude than said first current;
   magnifying the capacitance of said capacitor in said integrated circuit with at least two integrated transistors to produce an equivalent capacitance of said integrated circuit, said equivalent capacitance higher than said capacitance of said capacitor by a magnification factor, a first and a second transistor of said two integrated transistors, each of said first and second transistor comprises an emitter, wherein said emitter of said first transistor comprising a size that is larger than that of said emitter of said second transistor;
   feeding back a current that is a function of output current of said integrated circuit to said second transistor to increase said magnification factor; and
   buffering changes in said output current from said second transistor,
   wherein said feeding back comprises feeding back a current equal to a portion of output current of said integrated circuit to a base and a collector of said second transistor, said feeding back causing said magnification factor to increase.

2. A method of providing capacitance with an integrated circuit, said method comprising:
- amplifying a first current across a capacitor to generate an amplified current, said amplified current having a greater magnitude than said first current;
- magnifying the capacitance of said capacitor in said integrated circuit with at least two integrated transistors to produce an equivalent capacitance of said integrated circuit, said equivalent capacitance higher than said capacitance of said capacitor by a magnification factor, a first and a second transistor of said two integrated transistors, each of said first and second transistor comprises an emitter, wherein said emitter of said first transistor comprising a size that is larger than that of said emitter of said second transistor;
- feeding back a current that is a function of output current of said integrated circuit to said second transistor to increase said magnification factor; and
- buffering changes in said output current from said second transistor,
- wherein said buffering comprises buffering changes in said output current from said second transistor with a third transistor, said third transistor having a fixed base-to-emitter voltage.

3. A method of providing capacitance with an integrated circuit, said method comprising:
- amplifying a first current across a capacitor to generate an amplified current, said amplified current having a greater magnitude than said first current;
- magnifying the capacitance of said capacitor in said integrated circuit with at least two integrated transistors to produce an equivalent capacitance of said integrated circuit, said equivalent capacitance higher than said capacitance of said capacitor by a magnification factor, a first and a second transistor of said two integrated transistors, each of said first and second transistor comprises an emitter, wherein said emitter of said first transistor comprising a size that is larger than that of said emitter of said second transistor;
- feeding back a current that is a function of output current of said integrated circuit to said second transistor to increase said magnification factor; and
- buffering changes in said output current from said second transistor, wherein:
- said magnifying comprises magnifying the capacitance of a capacitor in said integrated circuit with said first transistor, said second transistor, and a third transistor comprising an emitter, said emitter size of said second transistor and said emitter size of said third transistor being substantially equal and said emitter of said first transistor comprising a larger size than said emitters of said second and third transistors.

4. The method of claim 3 further comprising prior to said magnifying:
- coupling a base and a collector of said third transistor to a first terminal of said capacitor; and
- coupling a base and a collector of said second transistor to said emitter of said third transistor.

5. An integrated circuit having an equivalent capacitance, said circuit comprising:
- a capacitor having first and second terminals, said equivalent capacitance greater than the capacitance of said capacitor;
- an output node coupled to said second terminal of said capacitor;
- a first current source;
- a first transistor having a base and collector coupled to said first terminal of said capacitor and to said current source;
- a second transistor having a base coupled to receive a current that is a function of output current at said output node, said second transistor having a collector coupled to said base and to an emitter of said first transistor, said second transistor having an emitter the same size as said emitter of said first transistor;
- a third transistor having an emitter larger than said first transistor, said third transistor having a collector coupled to said second terminal of said capacitor and to said output node;
- a second current source; and
- a fourth transistor having an emitter coupled to said second current source and to a base of said third transistor, said fourth transistor having a base coupled to said collector and base of said first transistor.

6. The integrated circuit of claim 5 wherein said fourth transistor emitter is larger than said first and second transistor emitters.

7. The integrated circuit of claim 6 wherein said fourth transistor emitter is smaller than said third transistor emitter.

8. The integrated circuit of claim 5 wherein said emitters of said second and third transistors are coupled to a first voltage substantially at ground potential.

9. The integrated circuit of claim 8 wherein said collectors of said third and fourth transistors are coupled to a second voltage, said second voltage greater than said first voltage.

10. An integrated circuit having an equivalent capacitance, said circuit comprising:
- a capacitor having first and second terminals, said equivalent capacitance greater than the capacitance of said capacitor;
- an output node coupled to said second terminal of said capacitor;
- a first current source;
- a first transistor having a base and collector coupled to said first terminal of said capacitor and to said current source;
- a second transistor having a collector and base coupled to an emitter of said first transistor, said second transistor having an emitter the same size as said emitter of said first transistor coupled to a first voltage;
- a third transistor having an emitter coupled to a second voltage, a first collector coupled to said output node, and a base coupled to a second collector;
- a fourth transistor having a collector coupled to said second collector of said third transistor, said fourth transistor having a base coupled to said first terminal of said capacitor;
- a second current source coupled to an emitter of said fourth transistor;
- a fifth transistor having an emitter larger than said first transistor, said emitter coupled to said first voltage, said fifth transistor having a collector coupled to said second terminal of said capacitor, said fifth transistor having a base coupled to said emitter of said fourth transistor;
- a sixth transistor having an emitter coupled to said second voltage, said sixth transistor having a base and a first collector coupled together; and
- a seventh transistor having a collector coupled to said base and first collector of said sixth transistor, said seventh transistor having an emitter coupled to said first voltage, and said seventh transistor having a base coupled to said base of said fifth transistor.

11. The integrated circuit of claim 10 wherein a second collector of said sixth transistor is coupled to said base and collector of said second transistor.

12. The integrated circuit of claim 10 wherein a second collector of said sixth transistor is coupled to said base and collector of said first transistor.

13. The integrated circuit of claim 12 wherein said second collector of said sixth transistor is larger than said first collector of said sixth transistor.

14. The integrated circuit of claim 10 wherein said first collector of said third transistor is twice as large as said second collector of said third transistor.

15. The integrated circuit of claim 10 wherein said emitter of said fourth transistor is larger than said emitter of either said emitter of said first and second transistors and smaller than said emitter of said fifth transistor.

16. The integrated circuit of claim 10 wherein:

said first, second, fourth, fifth, and seventh transistors are NPN transistors; and said third and sixth transistors are PNP transistors.

* * * * *